United States Patent [19]

Satou et al.

[11] Patent Number: 5,418,071
[45] Date of Patent: *May 23, 1995

[54] SPUTTERING TARGET AND METHOD OF MANUFACTURING THE SAME

[75] Inventors: Michio Satou; Takashi Yamanobe; Takashi Ishigami; Mituo Kawai; Noriaki Yagi; Toshihiro Maki, all of Kanagawa; Minoru Obata, Tokyo; Shigeru Ando, Kanagawa, all of Japan

[73] Assignee: Kabushiki Kaisha Toshiba, Kanagawa, Japan

[*] Notice: The portion of the term of this patent subsequent to Mar. 15, 2011 has been disclaimed.

[21] Appl. No.: 12,845

[22] Filed: Feb. 4, 1993

[30] Foreign Application Priority Data

Feb. 5, 1992 [JP] Japan .................................. 4-054259

[51] Int. Cl.$^6$ .............................. B22F 7/06; B22F 3/14
[52] U.S. Cl. ...................................... 428/552; 428/546; 428/548; 428/551; 419/6; 419/5; 419/10; 419/32; 419/45; 419/48; 419/53; 419/54; 419/60; 75/229; 75/245; 75/246
[58] Field of Search ............... 428/546, 548, 551, 552; 419/5, 6, 10, 32, 45, 48, 53, 54, 60; 204/298.13; 75/229, 245, 246

[56] References Cited

U.S. PATENT DOCUMENTS 4,938,798  7/1990  Chiba et al. ........................... 75/230
5,196,916  3/1993  Ishigawa et al. ..................... 257/769
5,294,321  3/1994  Satou et al. ..................... 204/298.13

FOREIGN PATENT DOCUMENTS 0374931   6/1990  European Pat. Off. .
0442752   8/1991  European Pat. Off. .
0483375   5/1992  European Pat. Off. .
0496637   7/1992  European Pat. Off. .
3807579   9/1988  Germany .
63-227771 9/1988  Japan .
WO9118125 11/1991 WIPO .

OTHER PUBLICATIONS

European Search Report for application filed corresponding to the above-identified U.S. application.

Primary Examiner—Donald P. Walsh
Assistant Examiner—John N. Greaves
Attorney, Agent, or Firm—Finnegan, Henderson, Farabow, Garrett & Dunner

[57] ABSTRACT

In the present invention, metal silicide grains form an interlinked structure of a metal silicide phase, and Si grains which form a Si phase are discontinuously dispersed between the metal silicide phase to provide a sputtering target having a high density two-phased structure and having an aluminum content of 1 ppm or less. Because of the high density and high strength of the target, the generation of particles from the target during sputtering is reduced, and due to the reduced carbon content of the target, the mixing of carbon into the thin film during sputtering can be prevented.

21 Claims, 8 Drawing Sheets

10 μm

10 μm

10 μm

10 μm

10μm

10μm

10 μm

10 μm

10 μm

10 μm

SPUTTERING TARGET AND METHOD OF MANUFACTURING THE SAME

BACKGROUND OF THE INVENTION

1. Field of the Invention

The present invention relates to a sputtering target and a method of manufacturing the sputtering target. More specifically, the invention relates to a sputtering target of high density and high quality to be used for forming thin films such as electrodes and wiring members of semiconductor devices, and a method of manufacturing the sputtering target.

2. Description of the Related Art

Sputtering has heretofore been used for forming electrodes or wiring in semiconductor devices. Sputtering has been used because it is suitable for mass-production, and it produces high quality films. Sputtering may involve accelerating argon ions to collide against a refractory metal silicide-type target and release the metal silicide, which deposits as a thin film on a substrate adjacent to the target. It is immediately apparent that the properties of the silicide film formed by sputtering strongly depend upon the characteristics of the target.

Due to the increase in the degree of integration and miniaturization of the integrated semiconductor devices, the incidental production of particles (minute grains) from the sputtering target, e.g., during the formation of refractory metal silicide thin films, urgently needs to be reduced. This is because these minute particles (of approximately 0.2 to 10 $\mu$m size) which are generated from the target during the sputtering process, tend to be mixed in the deposited thin film, and consequently cause short circuits or the disconnection of wiring when the semiconductor device is used in a circuit, thus reducing the reliability of the device.

Various conventional methods have been proposed for manufacturing targets of high density and fine structure which generate a reduced amount of particles from the target.

For example, Japanese Patent Disclosure TOKKAI-SHO No. 61-179534 discloses a method wherein Si is impregnated into a semi-sintered raw material composed of a refractory metal component (M) and Si component. A structure is obtained having a spherical or oval shaped $MSi_2$ phase of 5 to 500 $\mu$m grain diameter dispersed in "continuous matrix" of Si, with contains impurities such as carbon and oxygen held to less than 50 ppm.

Japanese Patent Disclosure TOKKAI-SHO No. 63-219580 discloses a method wherein a mixture of a refractory metal (M) and Si is subjected to a silicide reaction under a high vacuum thereby forming a semi-sintered substance, which is then subjected to hot isostatic press sintering to obtain a high density target. A compact structure is obtained with a maximum $MSi_2$ grain size of less than 20 $\mu$m and a maximum grain size of free Si held below 50 $\mu$m. The target is a mixture of minute $MSi_2$ grains and free Si grains and contains less than 200 ppm oxygen. Because the oxygen content of the target is low, the resistance of the resultant thin film is also low.

Japanese Patent Disclosure TOKKAI-SHO Nos. 63-179061 and 64-39374 discloses a method wherein a powdered mixture of a refractory metal (M) and Si is subjected to a silicide reaction under high vacuum to obtain a sintered substance. The sintered substance is then pulverized and a composition-adjusting silicide powder is added thereto. The mixture is then subjected to a hot press sintering process to obtain a target having high density and reduced Si coagulation.

When melted Si is impregnated into a semi-sintered substance, it has been found that although a high density target can be obtained, as a result of the substantial reduction of impurities such as carbon, oxygen and the like, the silicon tends to form a matrix. Coarse and large Si portions are formed in large voids in the semi-sintered substance. The Si, having less rigidity than the metal silicide, tends to be broken down by thermal stress during the sputtering process, and because the Si exists in a continuous matrix, the strength of the entire target is reduced. As a result, such metal silicide targets readily collapse, and consequently a large number of particles are produced.

When a semi-sintered substance formed of pulverized Si powder is sintered under applied pressure, it has also been found that although targets of high density and compact structure can be obtained, the carbon contaminant mixed during the pulverizing step remains in the target. The portions of the structure containing excess carbon generate particles during sputtering.

In addition, where pulverized Si powder is formed by sintering under applied pressure into a semi-sintered substance that is not pulverized, a target of high density and dense structure can be obtained.

When pulverized Si powder is formed into a semi-sintered substance by sintering under applied pressure, pulverized, a composition adjusting silicide power is added thereto, and subjected to a hot-press sintering process, a target of high density and fine structure can be obtained. However, carbon contamination of the material increases, as does the amount of oxygen mixed into the material because of the two crushing steps. Accordingly, the amount of particles generated increases, and the electrical resistance of the thin film increases because of the oxygen in the thin film.

Even in the case of a high density target having a relative density of 99%, the amount of generated particles increases due to the impurities, and the products formed when a wiring pattern is etched on the thin film are waste.

Heretofore, because of the ease of controlling the composition of the silicide film, sputtering targets manufactured by a powder-sintering method have ordinarily been used. More specifically, the conventional metal silicide target has been produced by a method wherein a metal silicide (hereinafter noted $MSi_2$) obtained by reacting metal powder (M) of W, Mo and other metals, with silicon power (Si), and subjecting both to hot pressing or hot isostatic pressing (Japanese Patent Disclosure Nos. 61-141673, 61-141674 and 61-178474).

In such methods, the composition contains $MSi_{2.2}$ to $MSi_{2.9}$ and the volume of Si phase is 8 to 25 vol. %, which is much less than the volume of the $MSi_2$ phase. In such a press-sintering operation it is difficult to distribute the Si phase around the angular shaped $MSi_2$ grains obtained by pulverizing, and accordingly such processes produce a target having a nonuniform structure including coagulated portions of angular $MSi_2$ grains and localized portions of Si phase.

Another method involves impregnating Si into a semi-sintered silicide (Japanese Patent Disclosure No. 61-58866). In the infiltration process problems are created because the melting point of the $MSi_2$ phase is much different from the melting point of Si, and depends on the particular metal in the $MSi_2$ phase. For instance, the melting points of $WSi_2$, $MoSi_2$, $TiSi_2$ and $TaSi_2$ are 2165° C., 2030° C., 1540° C. and 2200° C., respectively. Where the $MSi_2$ phase has a melting point differing widely from the melting point of Si (1414° C.), and it is press-sintered at a temperature lower than the eutectic temperature, sintering does not progress between the $MSi_2$ grains. This reduces the bonding strength between the grains substantially, and creates a brittle product. Furthermore, the residual pores reduce the density of the structure.

When a silicide film is formed by sputtering utilizing such a target, the bonds between the grains tend to be broken by the energy of the argon ions, and particles are generated from the sputtered surface of the target, forming defective portions thereon.

Particularly in a case of high density integrated circuits and the like, particles mixed in the deposited thin film decrease the production of useful devices.

In the latter described conventional method, the composition of the target is controlled by impregnating molten Si into the semi-sintered silicide which has a predetermined density. However, when $MSi_2$ is synthesized by reacting M powder and Si powder to obtain a semi-sintered substance of a predetermined density, or where a semi-sintered substance of predetermined density is formed by sintering press-formed $MSi_2$, its density varies depending on the sintering temperature and time, and the applied pressure, so that it is extremely difficult to obtain a target of a desired composition.

According to the knowledge of the present inventors, if the powdered $MSi_2$ and Si are of high purity, there is no tendency for impurities to diffuse into the boundary between the $MSi_2$ phase and the Si phase of the target. In the absence of such impurities, the interfacial bonding strengths between the $MSi_2$ phase and the Si phase, and between the $MSi_2$ phase regions are high.

In addition, the sputtering operation becomes unstable when there is a large difference between the electrical resistance of the $MSi_2$ phase and the Si phase. For example, the electrical resistances of $WSi_2$, $MoSi_2$, $TiSi_2$ and $TaSi_2$ constituting the $MSi_2$ phase are 70, 100, 16 and 45 $\mu\Omega$·cm, respectively, while the electrical resistance of the Si phase is $3 \times 10^{10} \mu\Omega$·cm. Furthermore, because there is no interface layer between the $MSi_2$ phase and the Si phase, the electrical resistance in the boundary region changes abruptly. Particularly in the structure of the target manufactured in accordance with the latter method, high resistance Si phase is directly in contact with the $MSi_2$ phase of low resistance.

Accordingly, when sputtering is conducted using such target, an insulation breakdown between the $MSi_2$ phase and the Si phase inevitably occurs, causing electric current to abruptly start to flow. Thus, when the voltage exceeds a predetermined value, discharge of electricity occurs, and $MSi_2$ grains having weak interfacial bonding strength or parts composed of Si phase are liable to collapse and generate particles.

SUMMARY OF THE INVENTION

The present invention has been made in view of the above described difficulties, and the object of the invention is to provide a sputtering target of high quality capable of substantially preventing the generation of particles during sputtering, and capable of forming a thin film layer of high quality. Another object of the invention is to provide a method for manufacturing such a sputtering target.

According to the present invention, there is provided a sputtering target comprising a metal silicide phase of a stoichiometric composition $MSi_2$, where M designates a metal, having an interlinked structure, Si phase composed of Si grains discontinuously dispersed in the metal silicide phase to provide a dense two-phased structure, and aluminum in the amount of 1 ppm or less.

Furthermore, there is provided a method of manufacturing the sputtering target of the invention, capable of forming a sputtering target, wherein metal silicide, $MSi_2$, is interlinked to provide a metal silicide phase, a Si phase composed of Si grains discontinuously distributed in the metal silicide phase to provide a dense and minute mixed structure, and having an aluminum content of 1 ppm or less.

Preferably, the method for manufacturing the sputtering target comprises the steps of:

I. mixing metal powder (M) and Si powder (Si) at a Si/M atomic ratio ranging from more than 2.0 to 4.0 to form a mixed powder;

II. placing the mixed powder in a mold, and reducing the carbon and oxygen contents of the powder by heating the mold and its contents under a high vacuum and low temperature;

III. heating the mixed powder under high vacuum and under high applied pressure to synthesize and sinter the metal silicide; and IV. heating the resultant material under high vacuum and a high applied pressure, to a temperature just below the eutectic temperature, to densify and sinter the material.

Preferably, the metal powder used in this method is of high purity and having a maximum grain diameter of 10 $\mu$m or less, and the Si powder is of high purity and having a maximum grain diameter of 30 $\mu$m or less.

Furthermore, the mixed metal and Si powder is subjected to a reaction-melting-sintering process after reducing the carbon and oxygen contents so that silicide-synthesis, sintering and densifying of the structure are carried out continuously. The aforementioned reaction-melting-sintering process may be executed by hot pressing.

BRIEF DESCRIPTION OF THE DRAWINGS

The above and other objects and advantages of the invention will become more apparent and more readily appreciated from the following detailed description of the presently preferred exemplary embodiments of the invention taken in conjunction with the accompanying drawings wherein.

DESCRIPTION OF THE PREFERRED EMBODIMENTS

Figure 1A:
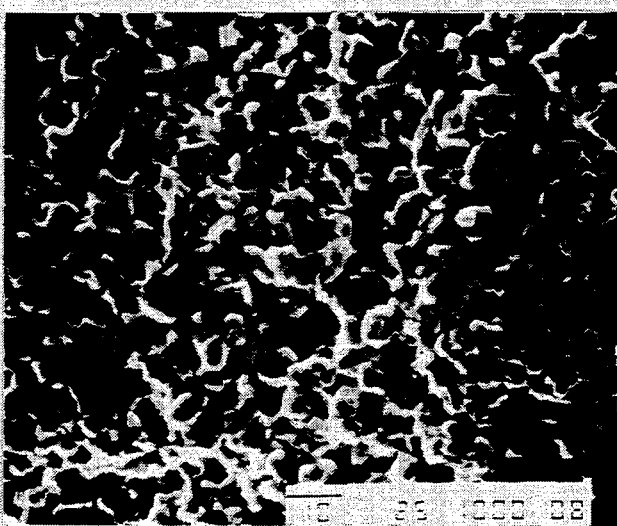
FIG. 1A is a scanning electron microscope photograph of a metallic structure of a target according to a preferred embodiment of the invention.
Figure 1B:
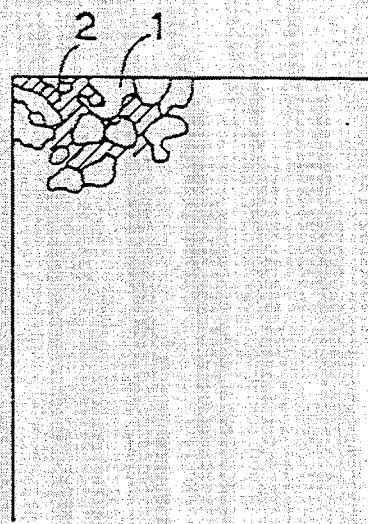
FIG. 1B is a partial schematic drawing of the metallic structure shown in FIG. 1A.

The present inventors have analyzed the problem of particle generation in metal silicide targets composed of sintered alloys, and believe that the particles generated heretofore in the refractory metal silicide targets produced by the powder sintering method are induced by abnormal electrical discharge occurring in the pores (or voids) in the target, resulting in the collapse of the portions of the target adjacent to these pores. Based on this belief, one objective of the invention was to increase the density of the target and reduce the number of pores.

Furthermore, the present inventors have determined that aluminum mixed into the target is likely to act as a particle generating source. More specifically, when the eroded surface of the target was magnified and observed after the sputtering process, it was discovered that those portions contaminated by aluminum were not sputtered sufficiently. The contaminated portions projected from the eroded surface and caused unstable plasma-discharge and the generation of particles.

The inventors also experimentally confirmed that the amount of aluminum contained in the target largely affects the reliability of the silicide thin film formed by sputtering. More specifically, the inventors found that aluminum located deep in the interfaces of layered thin films caused connecting leakage and the deterioration of the semiconductor device characteristics. For example, a diode having a sputtered thin film which forms a contact barrier layer on the p-n area of the substrate surface may have p-n junction leakage caused by aluminum diffusion into the film, and the leakage current may destroy the diode function.

The source of the aluminum contamination in thin films is believed to be the mold release agent used when the target is sintered. Mold release agent is usually spread on the surface of the mold to prevent the adhesion between the mold and the material powders. A mold release agent, such as one having BN as the principal ingredient of the mold release, has impurities such as $Al_2O_3$, etc. The mold release agent is removed from the mold surface by frictional forces or thermal impact during hot pressing, and it then combines with the material powders. The amount of aluminum in the material powder is thereby increased.

The collapse of eroded Si portions due to thermal stresses, and the collapse of the $MSi_2$ phase due to the difference in sputtering rates between the $MSi_2$ phase and the Si phase, also generate particles. To withstand the temperature increase caused by the continuous bombardment of high speed argon ions during sputtering, the surface of the target is cooled from its rearside. Consequently, thermal stresses are created by the resultant temperature differential in the thickness direction and thermal deformation of the target, and act on the surface of the target. The Si phase, which has a lower strength than the $MSi_2$ phase, is broken down and particles are produced. More particularly, the eroded surface of the Si phase is much rougher than the surface of the $MSi_2$ phase, and the projecting portions of the Si phase tend to be broken down by thermal stresses or deformation stresses created by the sputtering cycles to generate particles. Furthermore, Si phase is preferentially eroded by sputtering relative to the $MSi_2$ phase, and when the $MSi_2$ phase is provided within a continuously distributed Si phase, forces seizing the $MSi_2$ phase are reduced in accordance with the erosion of the Si phase, and the $MSi_2$ phase forms single grains or combined grains, thereby producing particles.

The inventors have determined that the generation of particles caused by the collapse of the $MSi_2$ phase, the erosion of the Si phase by thermal stresses, or by the difference in sputtering rates between the $MSi_2$ phase and the Si phase, can be substantially reduced by forming a two-phased sputtering target wherein only small amounts of the Si phase can be easily broken off as particles. In the mixed structure, a minute Si phase is distributed discontinuously in the $MSi_2$ phase which forms an interlinked structure.

The inventors have also determined that the projecting portions created in the $MSi_2$ phase and the Si phase are another source for generating particles. When the eroded surface of a metal silicide target manufactured by a conventional method is viewed under a scanning electron microscope (SEM), a great number of minute projecting portions (3) are observed on the surface of coarse $MSi_2$ phase grains and the Si phase grains as shown in FIGS. 12A, 12B, and 13A, 13B. Furthermore, there is a close relationship between the presence of the projecting portions and the number of generated particles. Further study also revealed that the projecting portions are reduced in accordance with the reduction of the grain diameters of the $MSi_2$ phase and the Si phase, and when the maximum grain diameter of the $MSi_2$ phase is 10 μm or less, and the maximum grain diameter of the Si phase is 30 μm or less, the generation of particles can be substantially suppressed.

As a result of further study directed to obtaining a sputtering target of high density, minute structure, and minimum aluminum content, the following observations were made.

(1) When a mixed powder of minute M powder and Si powder is placed in a mold having a partition plate, subjected to a silicide reaction under no additional applied pressure, and heated under high vacuum, and the metal silicide obtained is sintered under a high applied pressure, carbon and oxygen on the Si surface react to form CO or $CO_2$, and the carbon and oxygen contained in the resultant product is reduced.

(2) The oxygen contained on the Si surface tends to react with Si to form SiO or $SiO_2$ gas, and reduce the oxygen content.

(3) Aluminum contamination is substantially reduced when the synthesis of metal silicide occurs by a silicide reaction conducted under a high applied pressure, and the metal completely forms minute $MSi_2$.

(4) A mixed structure can be obtained wherein $MSi_2$ forms an interlinked structure, and Si is distributed discontinuously in the $MSi_2$.

(5) The elimination of pores and the increase in density of the structure are promoted at a temperature just below the eutectic temperature of Si and $MSi_2$.

The inventors have also determined that by providing an interface layer containing at least one element selected from the group consisting of boron (B), phosphorus (P), antimony (Sb) and arsenic (As), between the $MSi_2$ phase and the Si phase, the bond strength between the two phases is increased. As a result, abrupt changes in electrical resistance can be avoided, thus reducing particle generation.

In the invention, metals such as molybdenum (Mo), tungsten (W), titanium (Ti), zirconium (Zr), hafnium (Hf), niobium (Nb), tantalum (Ta), vanadium (V), cobalt (Co), chromium (Cr), nickel (Ni) and the like, capable of forming a metal silicide thin film of a relatively low specific resistance, are used singly or in combinations of two or more elements to form the target. It is particularly advantageous to use refractory metals such as Mo, W, Ti, Zr, Hf, Nb and Ta for this purpose.

In comparison to the conventional electrode wiring materials, the above metals exhibit lower specific resistance and higher corrosion resistance at elevated temperatures. Thus, when silicides of these metals are used for electrode wiring of semiconductor devices, high-speed operation of the semiconductor devices is made possible, corrosion due to various agents, oxidation during production, and oxidation during high temperature treatment can be substantially prevented.

By controlling three principal variables; namely the grain size of the material powder, the heating temperature, and the applied pressure, a two-phased structure sputtering target containing 400 to $400 \times 10^4$ $MSi_2$ phase grains per $mm^2$ of the target, and $MSi_2$ grain diameters within the range of 0.5 to 30 $\mu m$, can be obtained. The average grain diameter of the $MSi_2$ phase is 2 to 15 $\mu m$, while the average gain diameter of the Si phase is 2 to 10 $\mu m$.

During the silicide synthesizing process, B, P, Sb and As contained in the Si material, and elements such as Fe, Ni, Cr, Al and the like, which are unavoidable elements, disperse to the interface region between the $MSi_2$ phase and the Si phase to produce an interface layer that increases the bonding strength between the two phases.

The invention will now be described in detail. When a mixed powder of M and Si is heated under an appropriate pressure, the Si is softened and it reacts with M to form $MSi_2$ of granular shape. Thus, at those locations where M is pressed into contact with Si, the temperature is locally increased by the heat of reaction of the $MSi_2$ reaction, further softening the Si. Consequently, grains partly transformed into $MSi_2$ gather around each $MSi_2$ grain, and thus $MSi_2$ grains are coupled to each other to form a linked structure. When the $MSi_2$ grains are separately distributed in the Si phase, the Si phase, having a greater sputtering rate, is initially eroded during the sputtering process, so that $MSi_2$ phase tends to drop out. To avoid this occurrence, it is necessary that the $MSi_2$ phase grains are coupled together in an interlinked structure.

Furthermore, when the grain diameter of the $MSi_2$ phase exceeds about 30 $\mu m$, projecting portions are formed during sputtering on the $MSi_2$ grains, and such projecting portions later generate particles. When the grain diameter of the $MSi_2$ phase is less than 0.5 $\mu m$, the $MSi_2$ phase drops out during sputtering which also generates particles. Accordingly, it is preferable that the grain diameter of the $MSi_2$ phase is from about 0.5 to 30 $\mu m$, more preferably from about 2 to 20 $\mu m$.

In the case where the grain diameter of $MSi_2$ is in the range of from about 0.5 to 30 $\mu m$, it is also preferable that 400 to $400 \times 10^4$ $MSi_2$ grains are provided per $mm^2$ of the mixed structure. In the case where the grain diameter of $MSi_2$ is in the range of from about 2 to 20 $\mu m$, it is preferable that 2,000 to 300,000 $MSi_2$ grains are provided per $mm^2$ of the mixed structure.

Furthermore, the size of $MSi_2$ depends on the diameter of the metal grains forming the metal silicide. However, most of the metal grains are coagulated so that $MSi_2$ grains of different grain diameters are produced. An increase in the variation of the range of grain diameters causes projections and recesses on the eroded surface from sputtering to become significant. Because of the increased variation in the surface level, the number of particles generated increases. For this reason, it is necessary to use uniformly sized grains, and it is desirable that the average grain diameter of the $MSi_2$ phase be from 2 to 15 $\mu m$, and preferably from about 5 to 10 $\mu m$. Herein, the average grain diameter is the average diameter of 100 grains of the metal silicide.

The most desirable shape of $MSi_2$ grains for forming the interlinked structure is a nearly spherical configuration. This is because spherical grains are less likely to drop out of the mixed structure, while angular grains readily generate particles because of abnormal discharge. Based on this reasoning, because metal grains obtained by the ion-exchange refining method are easily coagulated during the reduction process, and $MSi_2$ grains obtained by combining these metal grains exhibit significant projections and recesses, it is necessary to minimize the coagulation by a treatment under a reducing condition, or by adding a dispersing agent during mixing of the powders. Otherwise, it is preferable that metal grains produced by a chemical vapor deposition method (CVD), and hence having a good grain dispersing property, are used to obtain the $MSi_2$ phase.

In the CVD method, a material such as a halide, sulfide, hydride, or the like, is transformed into its vapor phase at a high temperature, subjected to a chemical reaction such as thermal decomposition, oxidation or reduction, and the reaction product is deposited on a substrate. This method is widely used for producing semiconductors and insulating films.

Si reacts with the metal grains to form $MSi_2$, with excess Si flowing around the $MSi_2$ grains to obtain a structure having Si distributed discontinuously in the gaps formed between the $MSi_2$.

Continuous distribution of Si promotes the collapse of grains because Si is preferentially eroded relative to $MSi_2$ during sputtering. Because of the reduction of mechanical strength due to the thermal stresses created in the target during sputtering, the Si portions susceptible to thermal shock tend to be broken down. Thus, to prevent the generation of particles by improving mechanical strength, it is advantageous that Si is distributed discontinuously in the $MSi_2$.

Furthermore, when the grain diameter of Si exceeds 30 μm, the eroded Si portions tend to collapse due to the thermal effects. In addition, the projecting portions formed in the Si phase during sputtering tend to generate particles. Therefore, the maximum grain diameter of Si is 30 μm or less, preferably 20 μm or less.

When the variation in grain diameter of the Si grains becomes large, the stress concentrates at the large grains, so that the part is easily broken by repetition of the thermal stress. For this reason, the average grain diameter of Si is preferably from 2 to 10 μm, and more preferably from 3 to 8 μm.

Herein, the grain diameter of Si is the average value of the maximum measurement and the minimum measurement of the Si phase located in the gaps of the $MSi_2$, while the average grain diameter of Si is the average value of the grain diameters of 100 Si grains.

It is desirable that a raw material Si powder of high purity, and possibly containing a doping agent, is used for the production of the target. It is desirable to minimize the content of the impurities contained in the Si powder because the impurities deteriorate the characteristics of the semiconductor device. For example, the amount of a radioactive element such as U or Th which will cause a soft-error is less than 5 ppb. The content of an alkaline metal element such as Na or K which will cause movable-ion contamination is less than 100 ppb. The heavy metal elements such as Fe, Ni, Cr and like deep-level impurities, are restricted to less than 1 ppm. Carbon causes particle generation and etching defects, and is restricted to less than 100 ppm, and oxygen, which causes increased resistance is restricted to less than 150 ppm.

The impurities such as C, O, Na, K and the like contained in the Si powder are adhered to the powder surface during the Si crushing steps. These impurities can be reduced by subjecting the contaminated Si powder to a heating process at from 1200° to 1300° C. for a period of 2 to 6 hours, under a vacuum lower than $10^{31}4$ Torr. It is desirable that the Si powder so produced is used to produce the target.

Ordinarily, when a target is formed from Si powder containing a doping agent, the doping agent is dispersed and condensed during the reaction and synthesis period to specific areas in the interfaces of the crystals. The doping agent thus dispersed causes disturbance in the boundaries between the $MSi_2$ phase and the Si phase to form an interface layer. The interface layer increases the bonding strength between the $MSi_2$ phase and Si phase, and makes the $MSi_2$ phase less likely to drop out from the mixed structure. Further, the existence of the interface layer of high doping agent density, in the boundary between the $MSi_2$ phase of low electrical resistance and the Si phase of high electrical resistance, eliminates abrupt variation of the electrical resistance, reduces abnormal discharge during sputtering, and thus reduces the generation of particles.

As a result of further study to realize a smooth variation of electrical resistance in the boundary region between the $MSi_2$ phase and the Si phase, the inventors have found that where a target is produced from Si powder and metal powder, or from $MSi_2$ powder containing at least one doping agent element selected from B, P, Sb and As, and also containing unavoidable elements (such as Fe, Ni, Cr, Al, etc.), and the electrical resistance of the powders is controlled, the target thus produced exhibits an improved correspondence between the electrical resistance of the $MSi_2$ phase and the Si phase, and the sputtering rate therefrom is uniform. Because an interface layer in which the above described element is diffused is formed between the $MSi_2$ phase and the Si phase, an abrupt variation of electrical resistance does not occur, and a target having an excellent interface strength is obtained.

Among the above described doping agents, B, P, Sb and As are capable of largely decreasing the electrical resistance, and when a Si phase containing these elements is used, the electrical resistances of both phases are sufficiently similar, rendering the sputtering rate more uniform, and providing a thin film of stable composition and uniform thickness. During sintering, the elements contained in the Si phase diffuse into the interface region between the $MSi_2$ phase and the Si phase, having a disturbance or deformation in the crystal structure, to form an interface layer. Unavoidable elements such as Fe, Ni impart effects similar to B, P, Sb and As.

The thickness of the interface layer varies depending on the amount of the doping agent contained in the Si phase, with a thickness of from 100 to 10,000 Å considered to be desirable. If the thickness of the interface layer exceeds 10,000 Å, the characteristics of the thin film tend to be nonuniform, and if the thickness is less than 100 Å, the above described advantages cannot be achieved. Accordingly, a more preferable thickness is from about 1,000 to 8,000 Å.

The thickness of the interface layer can be measured by a high resolution secondary ion mass spectroscope (SIMS). SIMS sputter etches a specimen with $O^{2++}$ or first order ions of $Cs^+$, and captures the second order ions thereby generated for a highly sensitive third-order analysis of the impurities on a surface layer. The thickness of the interface layer is measured by examining the depthwise profile of the doping agent contained in the Si phase until reaching the $MSi_2$ phase.

Herein, the thickness of the interface layer is defined as the distance from a first inflection point located on the concentration profile of the doping agent in the Si phase to a second inflection point. In other words the thickness of the interface layer is the distance from an inflection point located on an entailed portion of the profile of the doping agent in the Si phase to another inflection point.

The electrical resistivity of the Si phase is preferably from about 0.01 to 100 Ω·cm. When the resistivity is less than 0.01 Ω·cm, the sputtering rate of the Si phase increases, and the deeply eroded Si phase generates particles, and the desired film structure cannot be obtained. When the electrical resistivity exceeds 100 Ω·cm, the above described effects cannot be expected. Accordingly, the resistivity of the Si phase is more preferably from about 0.1 to 10 Ω·cm.

The mold release agent from the surface of the mold is mixed into the powders and enters the Si phase of the target. Consequently, the Si phase portions are not sputtered sufficiently, and remain on the eroded surface and project therefrom. As a result of abnormal discharge from these portions, particle generation is induced. When a large amount of aluminum in the mold release agent contaminates the thin film, the aluminum locates at a deep level in the interfaces of distinctly layered thin films and causes connecting leakage and the deterioration of the semiconductor device characteristics. To avoid these problems, the amount of aluminum in the target should be kept below at 1 ppm or less, preferably 0.5 ppm or less, and more preferably 0.2 ppm or less. The aluminum content is measured using an ICP emission analysis system and SIMS.

The portions of the target contaminated by carbon are also unsatisfactorily sputtered, and also remain on the eroded surface and project therefrom. As a result, plasma-discharge from these portions becomes unstable, causing abnormal discharge, and inducing particle generation. When a large amount of carbon is mixed into the thin film, carbon tends to remain in the part when wirings are formed by etching, and cause disconnections. Accordingly, it is necessary to control the carbon impurity level to 100 ppm or less, preferably 50 ppm or less, and more preferably 30 ppm or less. The carbon content is measured by a carbon detector using a combustion-infrared ray absorption method.

When a large amount of oxygen impurity is contained in the target, it mixes in the thin film during sputtering, and increases the electrical resistance of the thin film. To avoid this problem, the oxygen level is preferably less than 150 ppm, and more preferably 100 ppm or less. The oxygen content is measured by an oxygen analyzer using an inert gas melting-infrared ray absorption method.

The sputtering target of the invention forms a mixed structure of minute granular $MSi_2$ phase and Si phase. This structure is obtained by subjecting the mixed powder of metal powder and Si powder to a sinter synthesizing process to form the $MSi_2$ phase. The mixing ratio of the two powders is selected to provide a composition of $MSi_x$ wherein X meets the relationship $2.0 < X \leq 4.0$. That is, a relationship wherein excessive Si remains around the $MSi_2$ phase.

When the mixed powder is heated under an appropriate pressure, the Si is softened during its reaction with the metal powder to form $MSi_2$. The portions of the Si grains in contact with the metal grains undergo a local temperature increase due to the heat of reaction of the $MSi_2$, causing the Si to be further softened. As a result, the Si grains gather around the surface of the grains that are transforming into $MSi_2$ which further promotes the reactions. The $MSi_2$ phase grains are rigidly coupled together by a diffusion reaction, and a large amount of unreacted Si is slightly softened and surrounds the $MSi_2$-forming grains to The value of X in the composition $MSi_x$ is restricted to the densify the structure range of $2.0 < X \leq 4.0$ for several reasons. If X is 2.0 or less, a large tensile force is created in the metal silicide film, which deteriorates the bond between the film and the substrate and causes the film to peel off. When the value of X exceeds 4.0, the sheet resistance of the thin film becomes excessive, thus making the film unsuitable for use as an electrode wiring thin film.

Furthermore, there is a relationship between the relative density of the target and the quantity of particles generated. At a low density, numerous pores are present in the target. Abnormal discharge tends to occur in low density portions, along with target collapse and the generation of particles. For these reasons, it is desirable to achieve a relative density of more than 99%. Herein, the relative density, d, is defined as the ratio of the actual density, da, of the sintered substance measured according to Archimede's method, over the theoretical density, dt, of the sintered substance, i.e., d=da/dt.

Furthermore, the inventors have discovered that the severity of the separation of particles from the target during sputtering not only depends upon the presence of defective surface layers created in the $MSi_2$ phase and the Si phase, but also depends on the presence of work-induced defect layers, the surface condition, and residual stresses created when the sintered substance is subjected to machining steps such as grinding and finishing. During the grinding and finishing of the target, the work is machined by the hard grains of a high-speed grinder. When a brittle material such as the sintered silicide comprising a metal silicide and silicon is worked, inevitably granular chips are separated from the surface of the work. The inventors believe that during grinding, minute cracks are created on the surface of the work by stress caused by its contact with the hard abrasive grains, and thereafter, edge portions of the cracks are raised by the sudden release of the stress, and are separated from the target in the form of fragments. Ordinarily, during the working of a brittle material, the cutting depth or cutting load of each abrasive grain is sufficiently large so that the cracks are extended in the local stress field formed by the grains. By magnifying the minute collapse of the material, the working of the material progresses. Consequently, on the worked surface of the silicide sintered substance, a large number of work-induced defect layers such as grinding traces, voids, and minute cracks are created.

When sputtering is performed using the target having such defective layers on its entire surface, minute grains are stripped off and removed from the surface of the target by the impact of ions in the plasma, beginning at the above described defective portions, thus generating particles. To avoid this occurrence, it is desirable to finish the surface of the target to a surface roughness Ra (center line roughness) of less than 0.05 μm, and thus substantially eliminate the work defective layers such as minute cracks and defective portions caused by machining.

Herein, as is defined in Japanese Industrial Standard JIS-B0601, when a portion of a roughness curve having a measured length l in the direction of the center line is extracted, the X axis is located at the center line of the extracted portion, the Y axis is located in the direction of the longitudinal magnification, and the roughness curve is expressed by the relationship y=f(x). The surface roughness Ra which is expressed in microns is calculated as follows.

$$Ra = \frac{1}{l} \int_o^l |f(x)| dx$$

To reduce the finished surface roughness and to substantially remove any work-induced defect layers containing cracks and holes, it is important to reduce the severity of working. More specifically, it is necessary to use abrasive grains having a small and uniform grain size or to reduce the load of each abrasive grain by using a material such as a soft polisher having improved elasticity or viscoelasticity to limit the stress created in the material to a value lower than the breaking stress.

Accordingly, even for a brittle material such as a sintered substance including a metal silicide, when the aforementioned load is extremely small, crack-forming region are not formed, and it is possible to obtain a finished surface having minimal projection and recess. As practical methods to achieve this objective, lapping and polishing methods, or a mechanical/chemical polishing method for finishing the surface with extremely high precision are preferred. The mechanical/chemical polishing method combines a conventional mechanical method utilizing grinding, and a conventional chemical method of eroding the polished material surface by a chemical agent.

However, it is practically difficult to finish a sintered silicide substance to a desired size by use of these methods alone, and thus the surface must first be worked by a more efficient method such as grinding, and then finished by the combined use of lapping and polishing steps.

In the above-described surface working method, the abrasive grain size is reduced according to the progression of lapping, polishing, and mechanical/chemical polishing, and the roughness of the finished surface is also reduced accordingly. By applying such a working method to the metal silicide target, the amount of particles later generated from the target is substantially reduced. According to the knowledge of the inventors, there is a correlation between the amount of the particles generated and the roughness of the surface. In order to suppress the generation of particles, it is desirable that the surface roughness, Ra, of the worked surface be 0.05 $\mu$m or less, preferably 0.02 $\mu$m or less.

During sputtering by argon ion irradiation, the ion impacting point becomes a high temperature, high-stress field. Accordingly, when non-uniform residual stress remains in the target surface layer, the stress is redistributed by the high temperature, thus locally increasing the stress. As a result, large cracks including radial cracks are created, and the amount of the separated particles is considerably increased. Accordingly, it is preferable that the residual stress is reduced to less than 15 kg/mm$^2$, and more preferably to less than 5 kg/mm$^2$.

The manufacturing method of the invention will now be described in more detail. Step I comprises preparing and mixing metal powder and Si powder to obtain a mixed composition having an Si/M atom ratio of about 2.0 to 4.0. In this mixing step, the grain sizes of the two powders significantly affect the grain sizes of the synthesized MSi$_2$ and the Si dispersed between the MSi$_2$ grains. In order to provide a minute structure, it is preferable to use metal powder of a maximum grain size of 10 $\mu$m or less and Si powder of a maximum grain size of 30 $\mu$m or less.

In this step, the raw material powders are mixed together at an Si/M atom ratio of from about 2.0 to 4.0 in a ball mill or a V-shaped mixer of dry type to obtain a uniform mixture. An uneven mixture is undesirable because the composition and structure of the resultant target become uneven, as also will be the properties of the thin film thereby formed.

In order to prevent oxygen contamination, it is desirable that the mixing operation is carried out under vacuum or in an atmosphere of inert gas.

Furthermore, in consideration of the volatile loss of Si and SiO$_2$ from the surface of the Si powder when the powder is heated to a high temperature, an amount of Si powder somewhat larger than its objective value is mixed with the metal powder. The excessive amount of Si should be less than 5%.

In Step II, the mixed powder prepared by Step I is placed in a mold and heated at a low temperature and high vacuum to reduce its carbon and oxygen contents. The preferred mold structure is a mold composed of graphite on which surface BN mold release agent is applied. The mold release agent prevents adhesion between the mold and a partition plate. The partition plate is used in this step, and also in Steps III and IV as described below. The partition plate prevents the direct contact of the material powders. As materials for the partition plate, it is preferable to use a refractory metal such as Mo, W, Ta, etc., formed to a thickness of about 0.1 to 0.2 mm, because these metals withstand the high temperature of heat-sintering, or a metal which is readily fabricated such as Ni or Ti.

In the mold structure described above, even if BN is used as a mold release agent, aluminum contamination can be effectively prevented and the aluminum content in the target can be reduced to 0.2 ppm or less. In this step, it is important that the heating temperature, holding time, and the degree of vacuum are set to appropriate values when no pressure is applied. More specifically, it is desirable to set the heating temperature to about 800° to 1,300° C. depending on the metal M and its silicide synthesis temperature. At a temperature lower than 800° C., the removal of impurities is insufficient. At a temperature higher than 1,300° C., the silicide reaction is initiated, and the evaporation of impurities becomes insufficient, thus resulting in a target containing large amounts of carbon and oxygen. During the eutectic reaction between Si and MSi$_2$, large and coarse MSi$_2$ grains are formed, Si is melted, and a target having a continuous structure is formed. More preferably, the heating temperature should be from about 1,000° C. to 1,200° C.

It is advantageous to set the holding time to 1 to 10 hrs depending on the heating temperature. When the holding time is less than 1 hr, the above described advantages cannot be sufficiently obtained, and when the holding time is longer than 10 hrs, productivity is reduced. In order to reduce the carbon and oxygen sufficiently, the vacuum level within the hot-press is preferably set to 10$^{-4}$ Torr or less, and more preferably to 10$^{-5}$ Torr or less.

In Step III, the degassed mixed powder is heated under a high vacuum, and high pressure is applied to synthesize the MSi$_2$ phase. In this silicide synthesis step, the heating temperature and the applied pressure must be set to appropriate values so that the silicide reaction progresses gradually, MSi$_2$ grain growth is suppressed, and softened Si flows into the gaps between the MSi$_2$ grains. To achieve these requirements, it is desirable to set the heating temperature from about 1,000° to 1,300° C. depending on the silicide synthesis temperature of the metal M. If the heating temperature is less than 1,000° C., the silicide reaction is difficult to initiate, and if it exceeds 1300° C., the MSi$_2$ grains grow by a rapid silicide reaction and become coarse and large. Accordingly, it is desirable that the heating temperature is from about 1,100° C. to 1,300° C.

The heating rate is desirably set at less than 20° C./minute to obtain synthesized MSi$_2$ phase of a minute structure. In order to maintain good control of the silicide reaction rate, and to prevent absorption of impurity gas, it is desired that the reaction occurs in a high vacuum of less than $10^{-4}$ Torr.

Furthermore, because the applied pressure largely affects the grain diameter of the MSi$_2$ grains, it is desirable to set the pressure from about 100 to 400 kg/cm$^2$. When the applied pressure is less than 100 kg/cm$^2$, wrinkles are formed on the target and the MSi$_2$ grain size becomes too large. On the other hand, when the applied pressure is larger than 400 kg/cm$^2$, the graphite mold is easily broken. The applied pressure is more preferably set from about 200 to 300 kg/cm$^2$.

As for the atmosphere for the silicide synthesis, a high vacuum of less than $10^{-4}$ Torr is preferable as described above, in consideration of the silicide reaction rate and the absorption of impurity gas. However, if the vacuum in the hot press is suddenly increased, the mixed powder tends to flow out of the mold, and the density of the sintered substance will be insufficient despite completing subsequent Step IV. Accordingly, it is desirable to gradually increase the degree of vacuum in the hot press to a value of less than 100 Torr.

In Step IV, the sintered substance is heated under a high vacuum and under a high applied pressure, at just below the eutectic temperature of Si and MSi2, to obtain a minute and dense sintered structure. In order to obtain a dense sintered substance, the applied pressure, heating temperature, and heating time at temperature must be controlled.

The applied pressure used in this step is preferably from about 200 to 400 kg/cm$^2$ to promote the density of the sintered substance. When the applied pressure is lower than 200 kg/cm$^2$, the density of the resultant sintered substance is low, and a large number of residual pores remain after sintering. If the applied pressure exceeds 400 kg/cm$^2$, the density of the sintered substance will be high, but the graphite mold tends to break. Accordingly, a range of from about 250 to 350 kg/cm$^2$ is more preferably employed.

As for the sintering temperature, T, of Step IV, a temperature just below the eutectic temperature, Ts, i.e., Ts-50≦T<Ts, is preferable. The eutectic temperatures where W, Mo, Ti and Ta constitute the metal are 1,400° C., 1,410° C., 1,300° C. and 1,385° C., respectively. When T is lower than Ts-50, residual pores remain in the sintered structure, and thus it is difficult to obtain a high density sintered substance. On the other hand, when T is higher than Ts, the Si phase melts and flows out of the mold, thus producing a sintered product having a large deviation in the final component ratio.

Furthermore, the holding time at the heating temperature is preferably from 1 to 8 hrs. When the holding time is below 1 hr, numerous residual pores remain in the sintered material, and thus a sintered substance of high density cannot be obtained. When the holding time is longer than 8 hrs, the density of the sintered substance is not further increased, and so the efficiency of manufacturing the target is reduced. It is desirable that the densifying sintering step be done under vacuum or in an atmosphere of inert gas to prevent contamination by impurities. Nitrogen atmosphere is undesirable because it tends to produce Si$_3$N$_4$.

The production and characteristics of the present invention will now be described in detail with respect to the following embodiments.

Embodiments 1 to 12

According to Table 1, a high purity metal powder composed of W, Mo, Ta or Nb, and having a maximum grain diameter of 10 μm or less, was mixed with a high purity Si powder having a maximum grain diameter of 30 μm or less at a Si/M atom ratio of 2.7, and the resultant mixed powder was further subjected to a mixing treatment in a ball mill under a high purity Ar gas atmosphere for 48 hrs.

A BN mold release agent was applied on the surface of a graphite mold, and a Ta partition plate of 0.2 mm thickness was also placed on the mold surface. The mold was then filled with the mixed powder.

Next, the mold was placed in a hot press machine and the mixed powder was deoxidized and decarbonized to reduce its impurities under the conditions listed in Table 1.

The silicide synthesizing employed the conditions listed in Table 1. The obtained sintered body was then ground, polished, and finished by electric discharge to obtain a target having a diameter of 260 mm, and a thickness of 6 mm.

Reference Example 1 was prepared from a high purity metal powder composed of W, Mo, Ta or Nb, and having a maximum grain diameter of 100 μm or less, which was mixed with a high purity Si powder having a maximum grain diameter of 200 μm or less at a Si/M atom ratio of 2.7. The resultant mixed powder was further mixed in a ball mill under a high purity Ar gas atmosphere for 48 hrs.

A BN mold release agent was applied on a surface of a graphite mold. The mold was then filled with the mixed powder. Next, the mold was inserted in a hot press machine. The mixed powder was, without being deoxidized and decarbonized under a low temperature to reduce its impurities, subjected to silicide synthesizing and a densifying sintering process under the conditions listed in Table 1. The resultant sintered body was then formed into a target having a diameter of 260 mm and a thickness of 6 mm by grinding, polishing and discharge finishing.

Conventional Example 1

A mixed powder was prepared by mixing a high purity metal powder composed of W and having a maximum grain diameter of 100 μm or less, with a high purity Si powder having a maximum grain diameter of 200 μm or less, at a Si/M atom ratio of 2.0. The mixed powder was then heated under a vacuum of $2 \times 10^{-4}$ Torr and at a temperature of 1,350° C. for 4 hrs to obtain a semi-sintered substance, which was subsequently impregnated with melted Si to provide a sintered substance having a Si/M atom ratio of 2.7. The sintered substance was then formed into a target having a diameter of 260 mm and a thickness of 6 mm by grinding, polishing and discharge finishing.

Conventional Example 2

A mixed powder was prepared by mixing high purity W powder having a maximum grain diameter of 15 μm or less, with a high purity Si powder having a maximum grain diameter of 20 μm or less at a Si/M atom ratio of 2.7. The mixed powder was then heated under a vacuum of $2 \times 10^{-4}$ Torr at a temperature of 1,200° C. for 4 hrs to obtain a semi-sintered substance. The semi-sintered substance was then placed in a sealed can, and subjected to hot isostatic pressing under a pressure of 1,000 atmospheres at a temperature of 1150° C. for 3 hrs to form a sintered body. The sintered body was ground, polished and discharge finished to form a target having a diameter of 260 mm and a thickness of 6 mm.

Conventional Example 3

A mixed powder was prepared by mixing a high purity W powder having a maximum grain diameter of 100 μm or less, with a high purity Si powder having a maximum grain diameter of 200 μm or less, at a Si/M atom ratio of 2.0. The mixed powder was then heated under a vacuum of $5 \times 10^{-4}$ Torr at a temperature of 1,300° C. for 4 hrs to obtain a semi-sintered substance. The semi-sintered substance was then crushed, and combined with silicide synthesized powder to obtain a Si/M atom ratio of 2.7. The resultant substance was then hot pressed in an argon gas atmosphere at a temperature of 1,380° C. for 3 hrs to obtain a sintered body. The sintered body was then polished by grinding and electric discharge finished to obtain the Conventional Example 3 target having a diameter of 260 mm and a thickness of 6 mm.

Figure 2A:
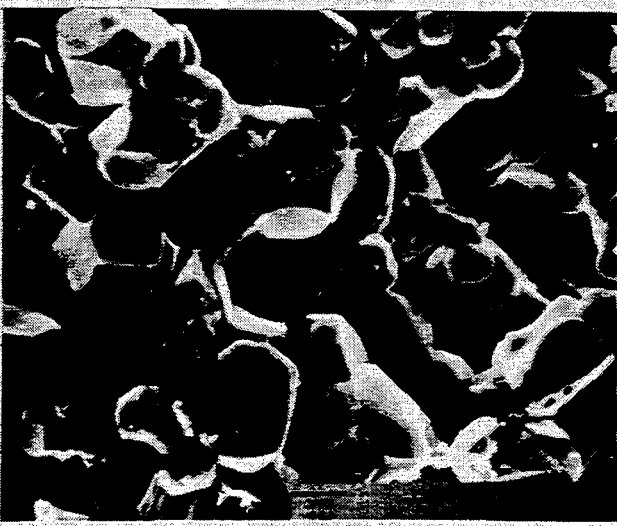
FIG. 2A is a scanning electron microscope photograph showing a metallic structure of a conventional target.
Figure 2B:
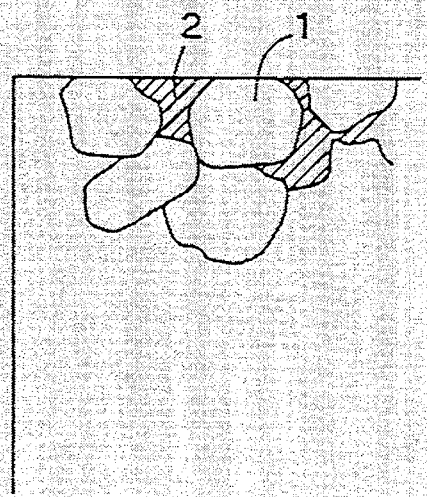
FIG. 2B is a partial schematic drawing of the metallic structure shown in FIG. 2A.

Microscopic observations of the surfaces of sections of the embodiment target and the reference example target are shown in FIGS. 1A, 1B and 2A, 2B, respectively. As shown in FIGS. 2A and 2B, the structure of the target according to the reference example exhibited uneven separation of Si (2) and coarse MSi$_2$ (1). The target of the embodiment shown in FIGS. 1A and 1B exhibited a minute and uniform structure wherein MSi$_2$ (1) having a maximum grain diameter of 10 μm or less formed an interlinked structure, and Si (2) was discontinuously distributed in the gaps of the MSi$_2$.

The contents of aluminum in the embodiment targets, reference example targets and conventional example targets are reported in Table 2. The aluminum contents of each of the embodiment examples were 1 ppm or less, while the aluminum contents of the reference example targets and the conventional example targets were higher and varied considerably.

Furthermore, by measurement it was found that the targets of the embodiments had carbon contents less than about 50 ppm and oxygen contents less about 250 ppm. In the targets of the reference examples, the carbon and oxygen contents were approximately 120 ppm, and 1,300 ppm, respectively. In the targets of the conventional examples, the carbon and oxygen contents were about 40–50 ppm and 40–1,500 ppm, respectively.

The measured relative densities of these targets are also listed in Table 2. The data shows that the relative densities for the embodiment targets were greatest.

Table 2 also lists the results for the case where the targets obtained in accordance with Embodiments 1 to 12, Reference Examples 1 to 12, and Conventional Examples 1 to 3, were set in a magnetron sputtering apparatus, and sputtering was conducted under an argon gas pressure of $2.3 \times 10^{-3}$ Torr so that silicide thin films of approximately 3,000 Å were formed on five inch Si wafers. The amount of generated particles was then measured.

TABLE 1

| No. | M powder | Deoxidizing and Decarbonizing Conditions Temperature × Time (°C. × hr) | Pressure (Torr) | Silicide Synthesizing Conditions Temperature × Time (°C. × hr) | Pressure (kg/cm²) | Sintering Conditions for Densification Temperature × Time (°C. × hr) | Pressure (kg/cm²) |
|---|---|---|---|---|---|---|---|
| Embodiments | | | | | | | |
| 1 | W | 1150 × 2 | 8 × 10⁻⁵ | 1200 × 3 | 270 | 1400 × 4 | 280 |
| 2 | W | 1100 × 5 | 8 × 10⁻⁵ | 1250 × 3 | 220 | 1400 × 5 | 300 |
| 3 | W | 1000 × 7 | 8 × 10⁻⁵ | 1300 × 2 | 180 | 1380 × 5 | 330 |
| 4 | Mo | 1000 × 3 | 7 × 10⁻⁵ | 1050 × 3 | 260 | 1400 × 4 | 290 |
| 5 | Mo | 950 × 5 | 7 × 10⁻⁵ | 1100 × 2 | 240 | 1400 × 5 | 320 |
| 6 | Mo | 900 × 8 | 7 × 10⁻⁵ | 1150 × 2 | 210 | 1390 × 5 | 350 |
| 7 | Ta | 1050 × 3 | 9 × 10⁻⁵ | 1100 × 3 | 260 | 1360 × 4 | 270 |
| 8 | Ta | 1000 × 5 | 9 × 10⁻⁵ | 1150 × 3 | 250 | 1360 × 5 | 300 |
| 9 | Ta | 950 × 7 | 9 × 10⁻⁵ | 1200 × 2 | 200 | 1350 × 6 | 320 |
| 10 | Nb | 1050 × 3 | 8 × 10⁻⁵ | 1100 × 3 | 260 | 1360 × 4 | 290 |
| 11 | Nb | 1000 × 5 | 8 × 10⁻⁵ | 1150 × 3 | 220 | 1350 × 5 | 330 |
| 12 | Nb | 950 × 7 | 8 × 10⁻⁵ | 1200 × 2 | 180 | 1350 × 5 | 350 |
| Reference Examples | | | | | | | |
| 1 | W | — | | 1250 × 3 | 200 | 1380 × 4 | 250 |
| 2 | W | — | | 1300 × 3 | 200 | 1380 × 4 | 250 |
| 3 | W | — | | 1300 × 3 | 180 | 1380 × 4 | 250 |
| 4 | Mo | — | | 1100 × 3 | 200 | 1380 × 4 | 250 |
| 5 | Mo | — | | 1100 × 3 | 180 | 1380 × 4 | 250 |
| 6 | Mo | — | | 1100 × 3 | 150 | 1380 × 4 | 250 |
| 7 | Ta | — | | 1100 × 3 | 250 | 1360 × 4 | 250 |
| 8 | Ta | — | | 1100 × 3 | 220 | 1360 × 4 | 250 |
| 9 | Ta | — | | 1100 × 3 | 200 | 1360 × 4 | 250 |
| 10 | Nb | — | | 1100 × 3 | 200 | 1360 × 4 | 250 |
| 11 | Nb | — | | 1150 × 3 | 200 | 1360 × 4 | 250 |
| 12 | Nb | — | | 1150 × 3 | 180 | 1360 × 4 | 250 |
| Conventional Examples | | | | | | | |
| 1 | W | — | | — | | — | |
| 2 | W | — | | — | | — | |
| 3 | W | — | | — | | — | |

TABLE 2

| No. | M powder | Average grain diameter MSi₂ (μm) | Average grain diameter Si (μm) | Aluminum Content (ppm) | Oxygen Content (ppm) | Carbon Content (ppm) | Relative Density (%) | Number of Particles |
|---|---|---|---|---|---|---|---|---|
| Embodiments | | | | | | | | |
| 1 | W | 2 | 7 | 0.1 | 85 | 32 | 99.8 | 12 |
| 2 | W | 3 | 5 | 0.3 | 110 | 40 | 99.8 | 23 |
| 3 | W | 5 | 3 | 0.3 | 143 | 48 | 99.7 | 30 |
| 4 | Mo | 3 | 8 | 0.2 | 126 | 20 | 99.8 | 18 |
| 5 | Mo | 5 | 6 | 0.4 | 148 | 28 | 99.7 | 28 |
| 6 | Mo | 7 | 4 | 0.3 | 183 | 33 | 99.5 | 34 |
| 7 | Ta | 4 | 7 | 0.1 | 98 | 30 | 99.7 | 21 |
| 8 | Ta | 5 | 5 | 0.3 | 140 | 35 | 99.8 | 25 |
| 9 | Ta | 7 | 4 | 0.4 | 157 | 41 | 99.6 | 37 |
| 10 | Nb | 3 | 8 | 0.3 | 103 | 32 | 99.7 | 20 |
| 11 | Nb | 5 | 5 | 0.3 | 167 | 38 | 99.7 | 29 |
| 12 | Nb | 8 | 4 | 0.5 | 175 | 42 | 99.5 | 33 |
| Reference Examples | | | | | | | | |
| 1 | W | 33 | 55 | 8.7 | 1240 | 95 | 98.8 | 242 |
| 2 | W | 27 | 50 | 10.3 | 1370 | 110 | 98.6 | 258 |
| 3 | W | 23 | 47 | 9.8 | 1440 | 127 | 98.5 | 273 |
| 4 | Mo | 48 | 48 | 11.5 | 1180 | 112 | 98.5 | 262 |
| 5 | Mo | 37 | 42 | 10.2 | 1260 | 127 | 98.3 | 288 |
| 6 | Mo | 28 | 38 | 9.8 | 1310 | 136 | 98.2 | 302 |
| 7 | Ta | 47 | 54 | 9.5 | 1240 | 105 | 98.7 | 270 |
| 8 | Ta | 40 | 45 | 10.3 | 1310 | 117 | 98.5 | 287 |
| 9 | Ta | 37 | 41 | 10.4 | 1470 | 127 | 98.4 | 291 |
| 10 | Nb | 46 | 50 | 11.0 | 1110 | 98 | 98.7 | 274 |
| 11 | Nb | 41 | 48 | 10.2 | 1230 | 107 | 98.5 | 279 |
| 12 | Nb | 37 | 43 | 10.3 | 1370 | 119 | 98.4 | 285 |
| Conventional Examples | | | | | | | | |
| 1 | W | 85 | 48 | 1.1 | 43 | 48 | 98.0 | 423 |
| 2 | W | 20 | 30 | 2.5 | 970 | 67 | 99.2 | 78 |
| 3 | W | 32 | 27 | 12.4 | 1350 | 135 | 98.5 | 277 |

Figure 3A:
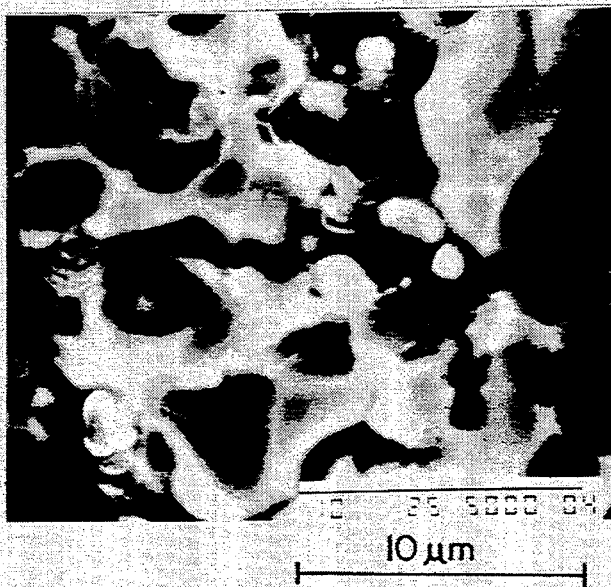
FIG. 3A is a micrograph of a target of an embodiment of this invention obtained by an optical microscope.
Figure 3B:
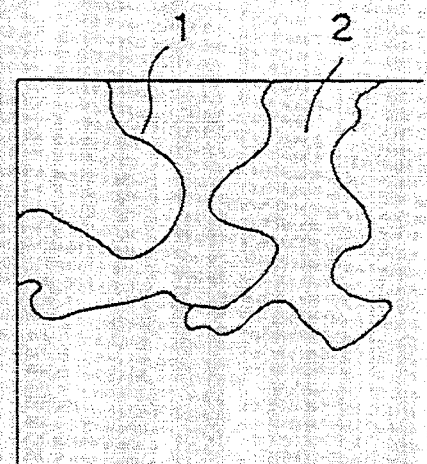
FIG. 3B is a partial schematic drawing of the metallic structure of FIG. 3A.
Figure 4A:
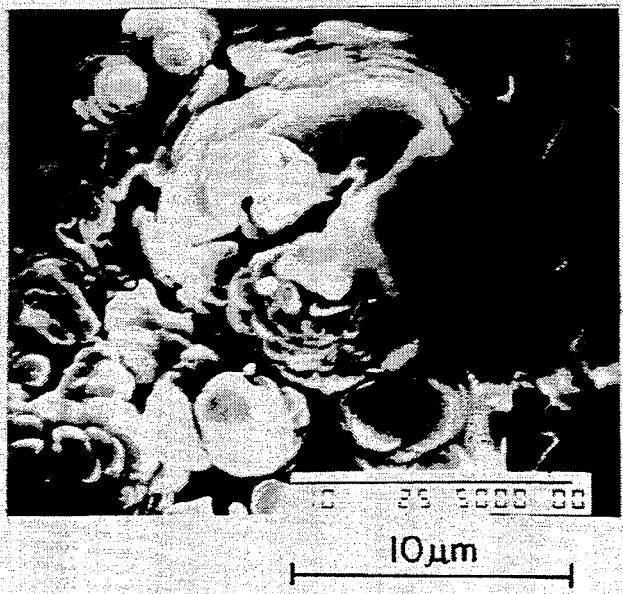
FIG. 4A is a micrograph obtained by an optical microscope of a target according to a reference example.
Figure 4B:
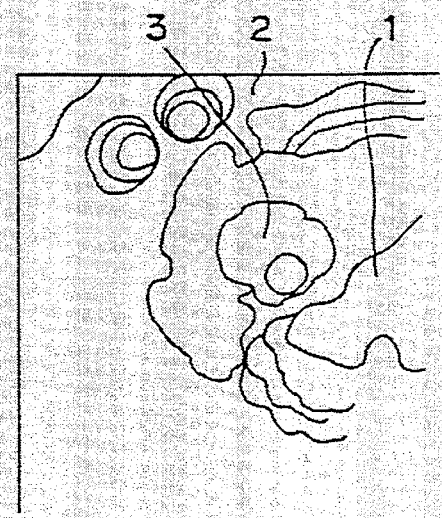
FIG. 4B is a partial schematic drawing of the metallic structure shown in FIG. 4A.

As is apparent from the data listed in Table 2, the number of particles generated from the targets according to the embodiments of the invention was much smaller than for the reference and conventional examples. Furthermore, when the eroded surfaces of the targets formed according to the embodiments, reference examples, and the conventional examples were observed under a scanning electron microscope (SEM), numerous projections (3) were discovered on the eroded surfaces of the targets obtained by the reference examples and the conventional examples as seen in FIGS. 4A and 4B. However, as shown in FIGS. 3A and 3B, no projections were observed on the eroded surfaces of the targets obtained by the embodiments of the invention.

Figure 5:
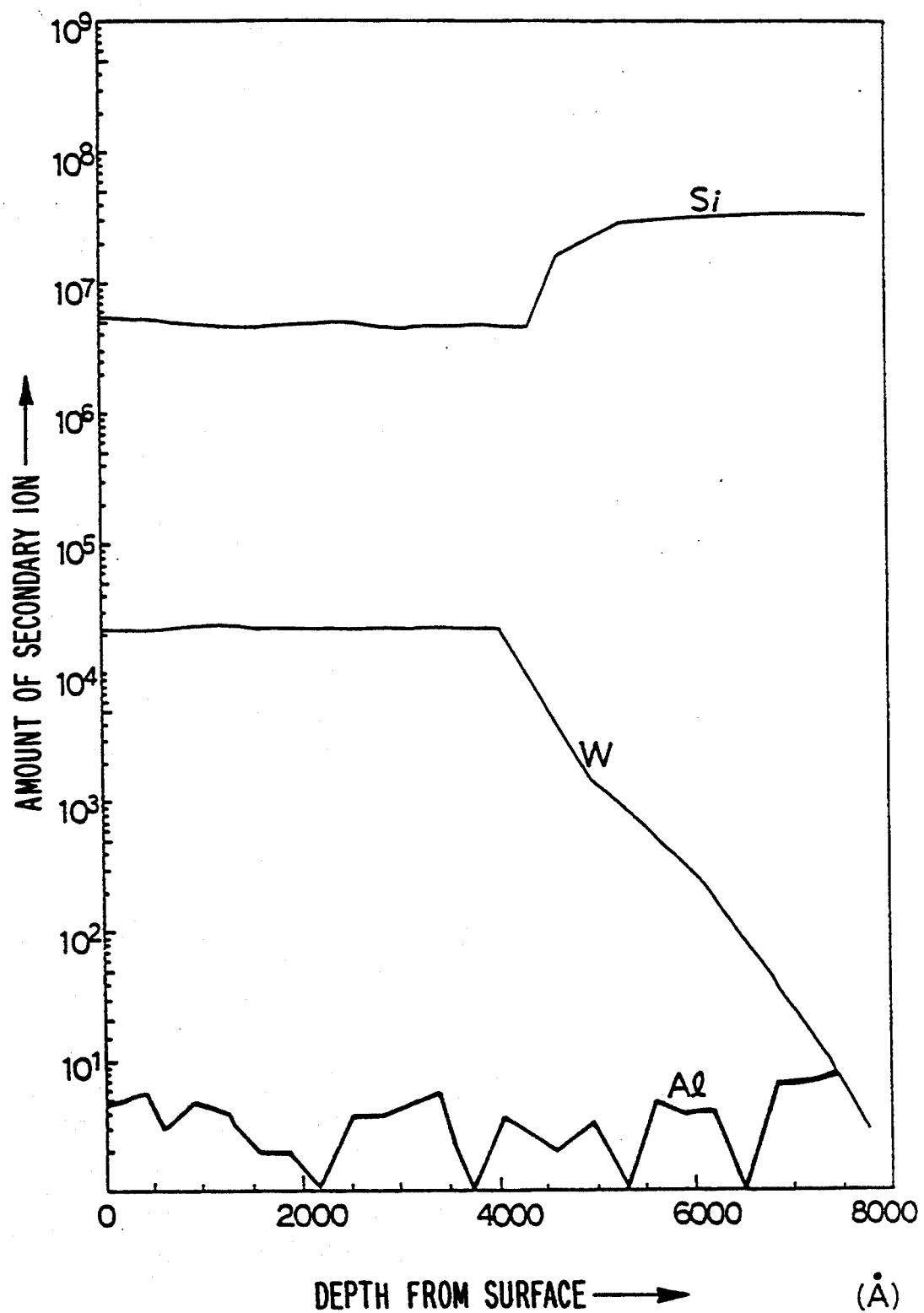
FIGS. 5, 6 and 7 are graphs showing the mass analysis results in the thickness direction by secondary ion mass analysis system (SIMS) of the silicide films according to an embodiment, a comparative example and a conventional example, respectively.
Figure 6:
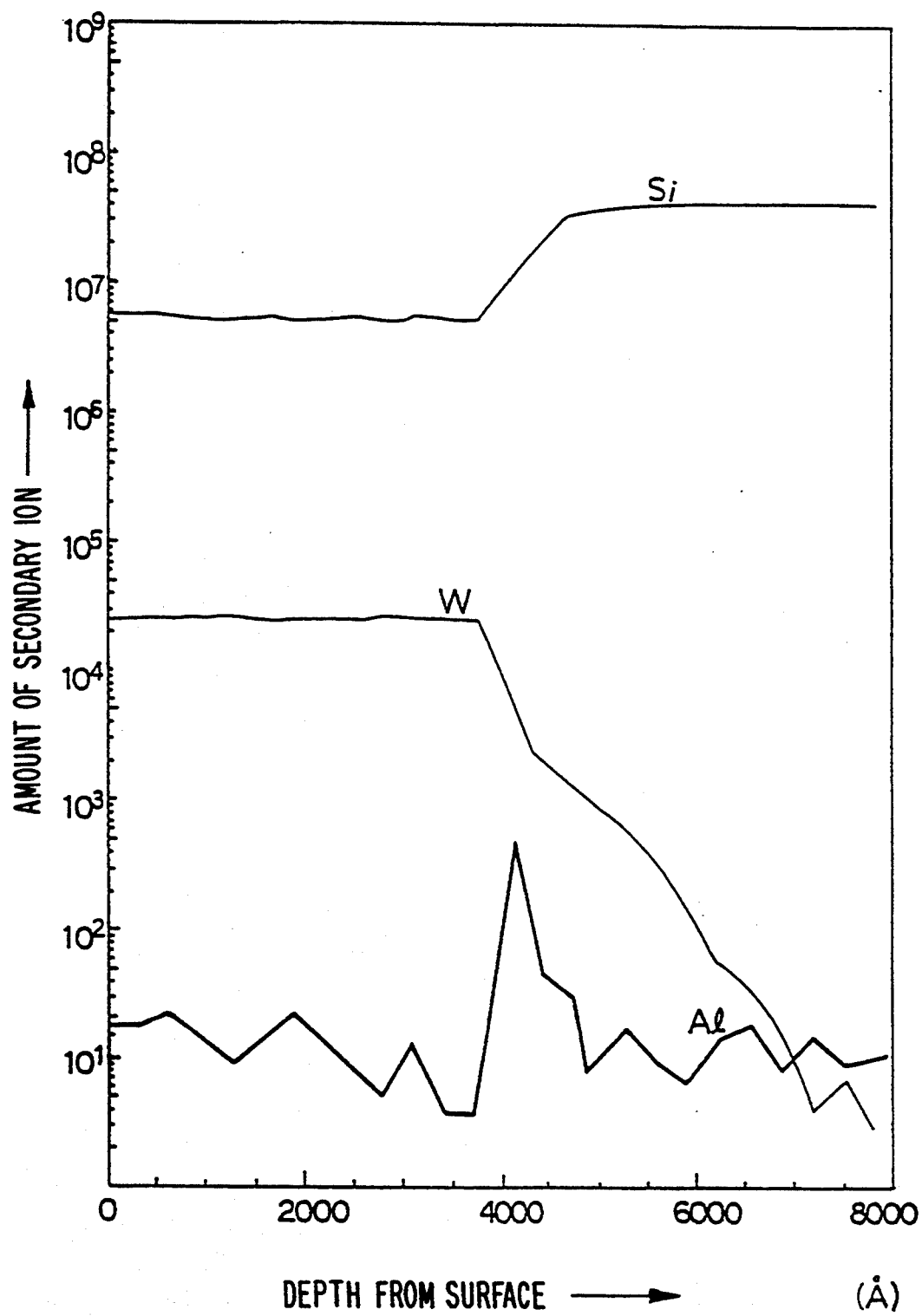
Figure 7:
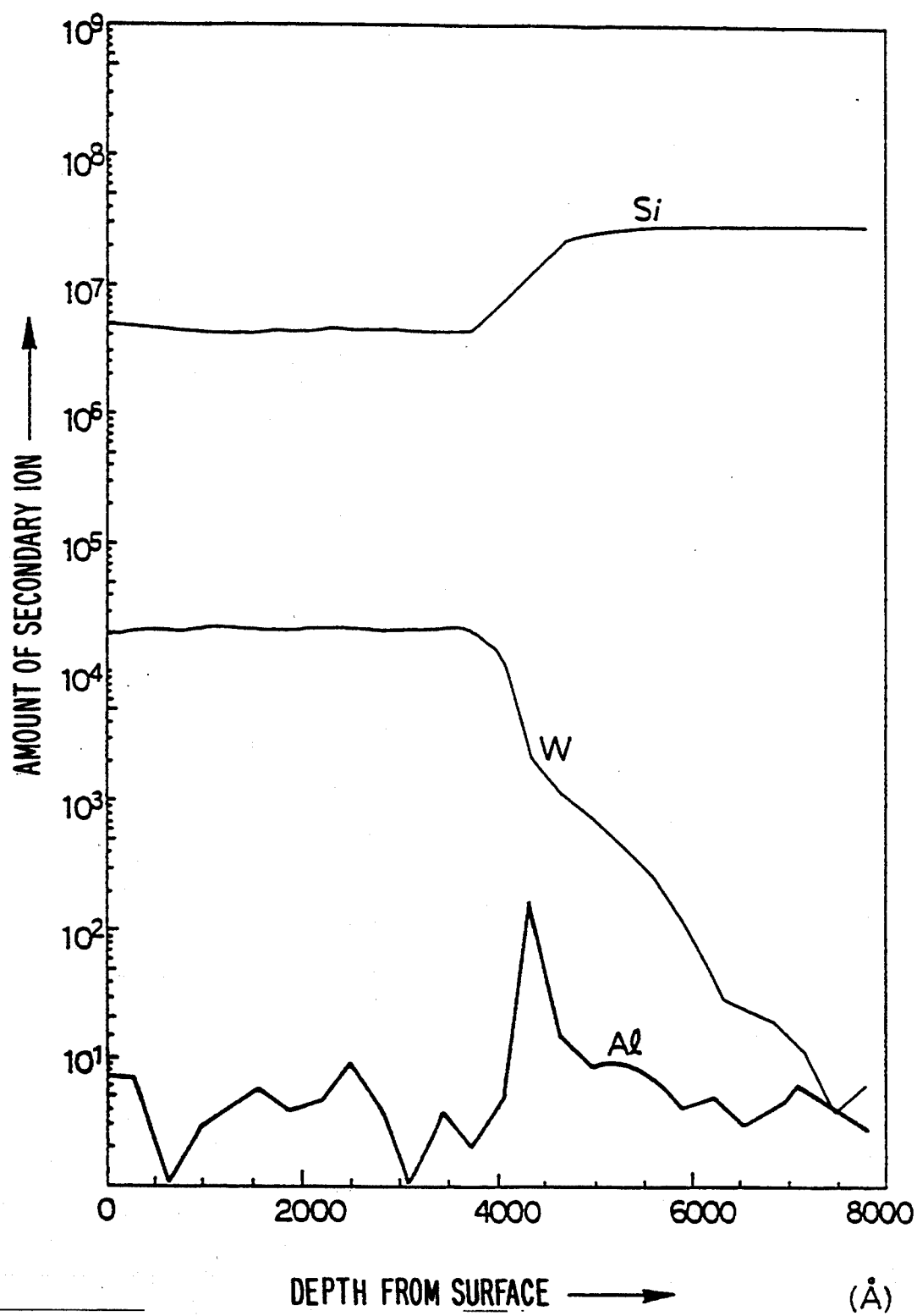

FIGS. 5, 6, and 7 are plots of the results of mass analysis in the thickness direction by a secondary ion mass analysis system (SIMS) for the silicide films according to the embodiment, comparative example and conventional example, respectively. In the embodiment, the amount of aluminum is reduced remarkably as seen in FIG. 5. It was determined that a target according to the embodiments of the invention provided improved production when it was utilized to form the electrode wiring of semiconductor devices.

The targets were then compared by forming an interface layer between the MSi₂ phase and the Si phase in the targets of the embodiments, and not providing an interface layer in the targets of the reference examples.

Embodiments 101 to 114

A high purity metal powder composed of W, Mo, Ti, Ta, Zr, Hf, Nb, V, Co, Cr or Ni, or a combination thereof, and having an average grain diameter of 2 μm was mixed with a high purity Si powder containing B, P, Sb, As and other unavoidable elements such as Fe, Ni and the like, having an average grain diameter of 20 μm, at a Si/M atom ratio of 2.6. The resultant mixed powder was subsequently dry mixed for 72 hrs in a ball mill containing a high purity argon gas atmosphere. The processed mixed powder was then placed in a hot press mold composed of high purity graphite. BN mold release agent was applied to a surface of the mold and a Nb partition plate was also placed on the mold surface. The mold was then placed in a vacuum hot press and degassed under a vacuum of $5 \times 10^{-5}$ Torr and at a temperature of 1,200° C. for 2 hrs.

Then, a metal silicide, MSi₂, was synthesized at 1,200° C. in a vacuum of $5 \times 10^{-5}$ Torr and under application of 250 kg/cm² applied pressure. High purity argon gas was used as the internal atmosphere of the hot press, the internal pressure was raised to 600 Torr, and the MSi₂ was sintered at 1,370° C. for 2 hrs. The resultant sintered body was then ground, polished and discharge finished to obtain a target of 260 mm diameter and 6 mm thickness.

Reference Examples 101 to 114

To obtain the targets of Reference Examples 101 to 110, a metal powder of high purity W, Mo, Ti, Ta, Zr, Hf, Nb, Co, Cr or Ni, having an average grain diameter of 25 μm was mixed with a high purity Si powder of 40μm average grain diameter at a Si/M atom ratio of 2.6, and then subjected to hot pressing under the following conditions:
temperature: 1,380° C.
applied pressure: 250 kg/cm²,
internal atmospheric pressure cycle:
   ¹ $8 \times 10^{-5}$ Torr vacuum up to 1,200° C.; and 2 600 Torr argon gas in the range of 1,200° C. to 1,380° C., A target having a diameter of 260 mm and a thickness of 6 mm was obtained.

To obtain Reference Examples 111 to 114, a $WSi_2$, $MoSi_2$, $TaSi_2$, or $NbSi_2$ powder having an average grain diameter of 80 μm was mixed with a high purity Si powder having an average grain diameter of 60 μm, at an Si/M atom ratio of 2.6. The mixed powder was then subjected to hot pressing under conditions similar to those used for Reference Examples 101 to 110, to obtain a target having a diameter of 260 mm and a thickness of 6 mm.

For the targets obtained in the Embodiments 101 to 114 and the Reference Examples 101 to 114, the average thickness of the interface layers of the embodiments, relative density, and flexural strength were measured, and the results are reported in Table 3. These data indicate that the targets of Embodiments 101 to 114 exhibit high density and high flexural strength, and the $MSi_2$ phase and the Si phase are rigidly bound by the interface layer.

Figure 8A:
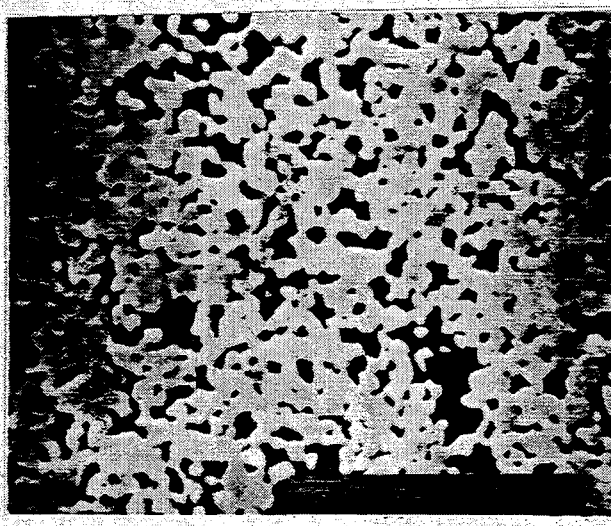
FIG. 8A is a scanning electron microscope photograph showing an eroded surface configuration of the target according to a preferred embodiment.
Figure 8B:
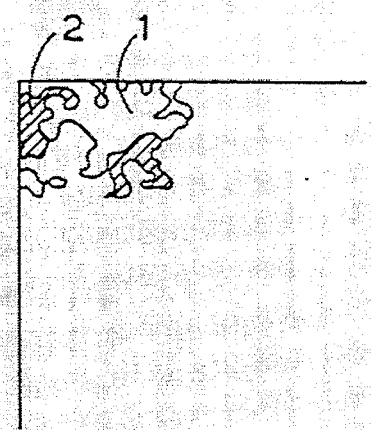
FIG. 8B is a partial schematic drawing of the surface configuration shown in FIG. 8A.
Figure 9A:
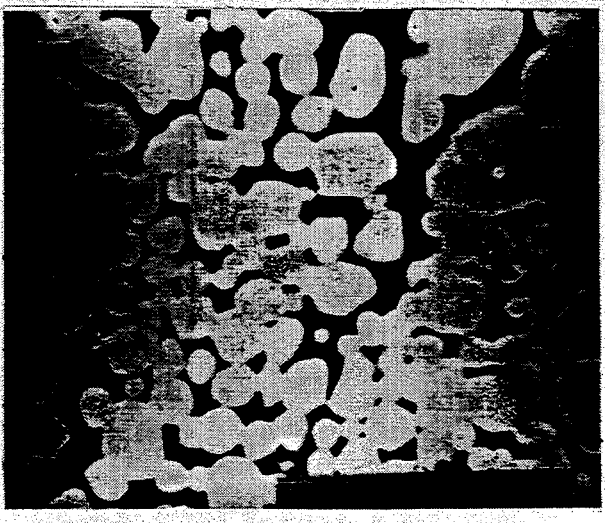
FIG. 9A is a scanning electron microscope photograph showing an eroded surface configuration of a conventional target.
Figure 9B:
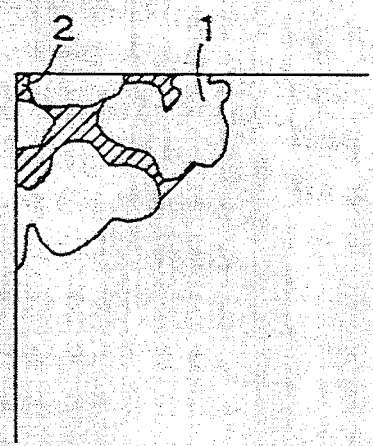
FIG. 9B is a partial schematic drawing of the surface configuration of FIG. 9A.
Figure 10A:
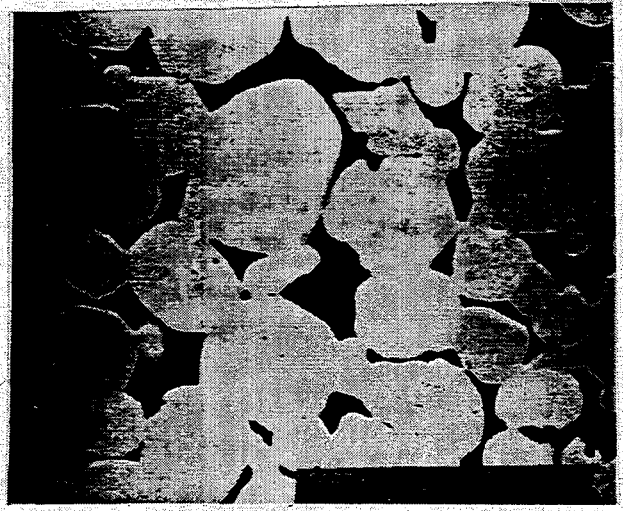
FIG. 10A is a micrograph obtained by an optical microscope of a target according to a conventional example.
Figure 10B:
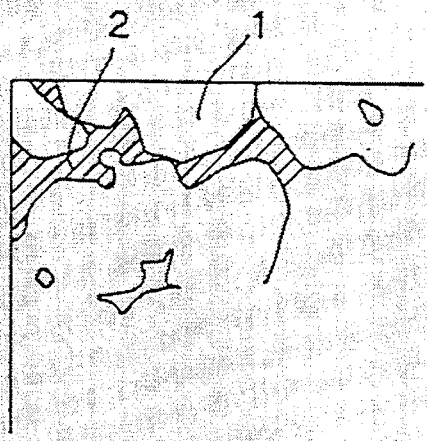
FIG. 10B is a partial schematic drawing of the metallic structure shown in FIG. 10A.

Furthermore, sections of the targets obtained for the embodiments, reference examples and conventional examples were observed by an optical microscope, and the results are shown in FIGS. 8A, 8B; 9A, 9B; and 10A, 10B, respectively. As is apparent from FIGS. 8A and 8B, the embodiment has a minute mixed structure of the $MSi_2$ phase (1) and the Si phase (2), having an average grain diameter of 10 μm. In the target according to the reference example, the Si phase (2) and the $MSi_2$ phase (1) were both coarse and large as shown in FIGS. 9A and 9B. In the target according to the conventional example, the Si phase (2) and the $MSi_2$ phase (1) were both coarse and large as shown in FIGS. 10A and 10B.

The targets obtained according to Embodiments 110 to 114 and the Reference Examples 101 to 114 were placed in a magnetron sputtering apparatus, and sputtering was conducted under an argon gas pressure of $2.3 \times 10^{-3}$ Torr to deposit a silicide thin film of 3,000 Å thickness on a five inch Si wafer. The amount of particles contained in the thin film was measured, and is reported Table 3.

TABLE 3

| | | Average grain diameter | | Si powder | | Target | | |
| | | | | | Electric Resistance | Average interface layer | Relative | Flexural |
| No. | Al powder or $MSi_2$ powder | $MSi_2$ (microns) | Si (microns) | Doping agent | Ratio (micro ohm. cm) | thickness (angstroms) | Density (%) | Strength (kg/m²) |
|---|---|---|---|---|---|---|---|---|
| Embodiments | | | | | | | | |
| 101 | W | 3 | 7 | B | 200 | 1830 | 99.5 | 48 |
| 102 | Mo | 5 | 5 | P | 80 | 1740 | 99.5 | 47 |
| 103 | Ti | 7 | 6 | P | 300 | 1580 | 99.4 | 43 |
| 104 | Ta | 6 | 7 | Sb | 300 | 1650 | 99.3 | 45 |
| 105 | Zr | 7 | 8 | B | 80 | 1590 | 99.5 | 40 |
| 106 | Hf | 5 | 8 | As | 60 | 2110 | 99.4 | 47 |
| 107 | Nb | 6 | 9 | B | 500 | 1750 | 99.3 | 48 |
| 108 | V | 8 | 7 | P | 400 | 1550 | 99.3 | 41 |
| 109 | Co | 8 | 7 | P | 50 | 1430 | 99.5 | 42 |
| 110 | Cr | 7 | 6 | Sb | 100 | 1680 | 99.7 | 47 |
| 111 | Ni | 6 | 7 | B | 200 | 1730 | 99.6 | 45 |
| 112 | Mo + W | 5 | 6 | P | 800 | 1820 | 99.5 | 50 |
| 113 | Ta + Mo | 6 | 6 | P | 100 | 1920 | 99.6 | 47 |
| 114 | Nb + Zr | 8 | 7 | Sb | 500 | 1870 | 99.4 | 43 |
| Reference Examples | | | | | | | | |
| 101 | W | 37 | 35 | — | $2.3 \times 10^{10}$ | — | 99.0 | 33 |
| 102 | Mo | 30 | 34 | — | " | — | 99.2 | 35 |
| 103 | Ti | 25 | 37 | — | " | — | 99.1 | 34 |
| 104 | Ta | 33 | 32 | — | " | — | 99.0 | 32 |
| 105 | Zr | 32 | 30 | — | " | — | 99.2 | 31 |
| 106 | Hf | 36 | 31 | — | " | — | 99.2 | 30 |
| 107 | Nb | 28 | 35 | — | " | — | 99.1 | 36 |
| 108 | Co | 35 | 36 | — | " | — | 99.0 | 33 |
| 109 | Cr | 27 | 32 | — | " | — | 99.3 | 32 |
| 110 | Ni | 38 | 33 | — | " | — | 99.2 | 35 |
| 111 | $WSi_2$ | 76 | 50 | — | " | — | 96.0 | 28 |
| 112 | $MoSi_2$ | 80 | 47 | — | " | — | 97.2 | 30 |
| 113 | $TaSi_2$ | 72 | 45 | — | " | — | 98.5 | 32 |
| 114 | $NbSi_2$ | 75 | 48 | — | " | — | 97.8 | 31 |

| No. | Aluminum Content (ppm) | Carbon Content (ppm) | Oxygen Content (ppm) | Produced thin film Amount of Particles (No.) |
|---|---|---|---|---|
| Embodiments | | | | |
| 101 | 0.3 | 28 | 102 | 35 |
| 102 | 0.2 | 30 | 84 | 43 |
| 103 | 0.2 | 27 | 95 | 32 |
| 104 | 0.1 | 35 | 77 | 47 |
| 105 | 0.4 | 38 | 97 | 41 |
| 106 | 0.5 | 29 | 105 | 45 |
| 107 | 0.2 | 33 | 113 | 38 |
| 108 | 0.3 | 38 | 127 | 30 |
| 109 | 0.1 | 40 | 132 | 48 |
| 110 | 0.3 | 37 | 147 | 42 |

TABLE 3-continued

|   |   |   |   |   |
|---|---|---|---|---|
| 111 | 0.4 | 35 | 125 | 40 |
| 112 | 0.4 | 27 | 74 | 37 |
| 113 | 0.5 | 31 | 85 | 45 |
| 114 | 0.3 | 38 | 94 | 47 |
| Reference Examples | | | | |
| 101 | 7.6 | 110 | 1340 | 137 |
| 102 | 5.8 | 125 | 1300 | 128 |
| 103 | 6.4 | 118 | 1290 | 143 |
| 104 | 8.2 | 136 | 1360 | 125 |
| 105 | 9.4 | 125 | 1170 | 133 |
| 106 | 7.7 | 119 | 1210 | 126 |
| 107 | 8.9 | 124 | 1230 | 145 |
| 108 | 7.1 | 133 | 1270 | 151 |
| 109 | 6.8 | 127 | 1150 | 137 |
| 110 | 6.5 | 108 | 1220 | 125 |
| 111 | 11.3 | 142 | 1250 | 490 |
| 112 | 10.4 | 133 | 1320 | 510 |
| 113 | 9.3 | 128 | 1240 | 525 |
| 114 | 9.8 | 120 | 1210 | 530 |

As is apparent from analyzing the data in Table 3, the number of particles generated from the targets of the embodiments were extremely small.

Figure 11A:
FIG. 11A is a scanning electron microscope micrograph showing an eroded surface of a target according to the embodiments of this invention.
Figure 11B:
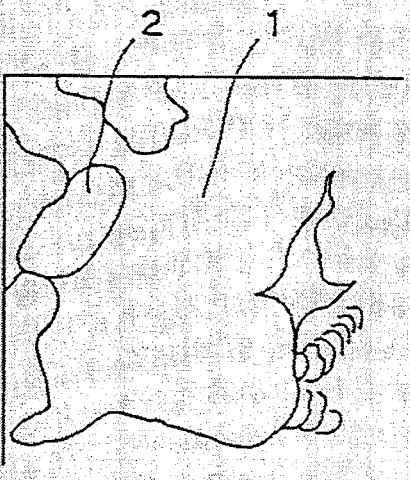
FIG. 11B is a partial schematic drawing of the eroded surface shown in FIG. 11A.
Figure 12A:
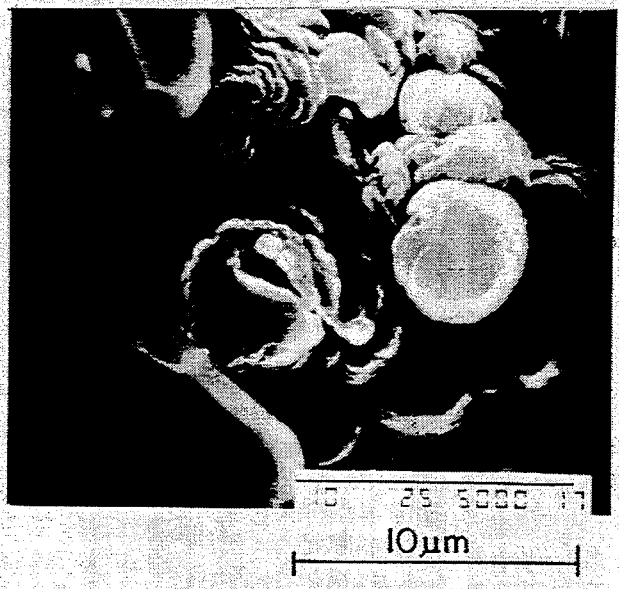
FIG. 12A is a scanning electron microscope micrograph of an eroded surface of a target according to reference examples.
Figure 12B:
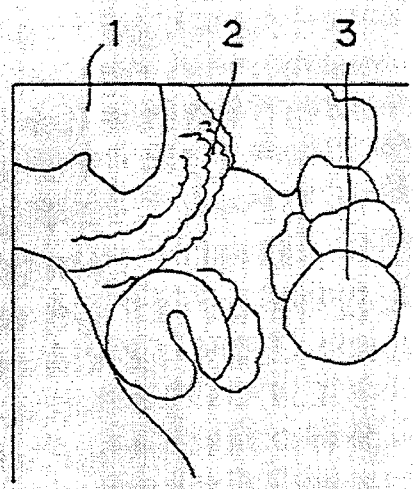
FIG. 12B is a partial schematic drawing of the eroded surface shown in FIG. 12A.
Figure 13A:
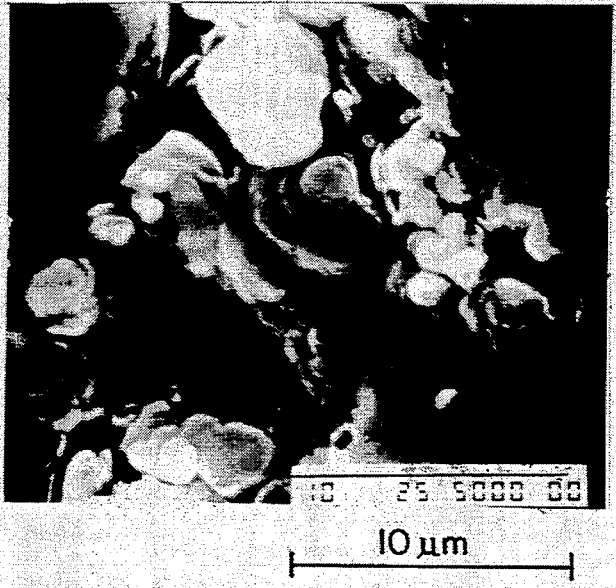
FIG. 13A is a scanning electron microscope micrograph showing an eroded surface of a conventional target.
Figure 13B:
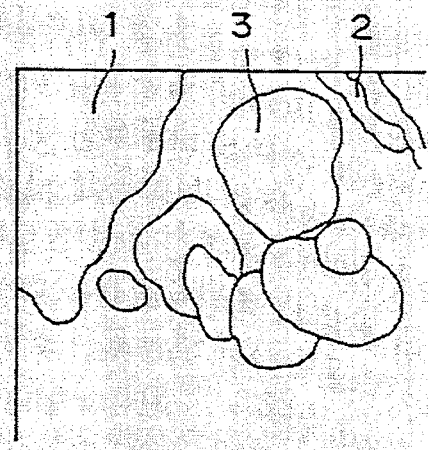
FIG. 13B is a partial schematic drawing of the eroded surface of FIG. 13A.

The sputtering surfaces of the targets obtained by the embodiments, reference examples, and conventional examples were observed with a SEM, and the observed structures are as shown in FIGS. 11A, 11B; 12A, 12B; and 13A, 13B, respectively. Although a large number of projections (3) were found on the sputtering surfaces of the reference examples (FIGS. 12A, 12B) and the conventional examples (FIGS. 13A, 13B), projections (3) were not observed on the surfaces of the targets according to the embodiments as evidenced by FIGS. 11A and 11B. These results confirmed that a substantial improvement could be expected in the production yield by using the target of the invention for forming electrodes and wiring of semiconductor devices.

Next, the effects caused by the generation of particles from the defective layer, and the surface condition and residual stresses created when the sintered silicide substance is subjected to a mechanical finishing operation such as grinding, will be described with reference to the following embodiments.

Embodiment 200

Sintered tungsten silicide was cut by wire electrical discharge machining to a diameter of 260 mm, and subsequently the sintered substance was ground to a thickness of 6 mm with a vertical axis rotary surface grinder with a SD270J55BW6 grinding wheel under the following conditions: grinding wheel peripheral speed of 1,200 m/min; table rotation speed of 12 rpm, and a grinding rate of 10μm/min.

After the rear surface of the target was soldered to a backing plate, the front surface was worked with a lens polisher and 15 μm diamond abrasive grains for 60 hrs, and then with 3 μm abrasive grains for 20 hrs. An ultrasonic cleaner was used to remove the working solution present on the lapped surface, and the surface was thereafter degreased with acetone and dried.

The worked surface was observed with a SEM, and no grinding streaks or holes caused by grinding, or fine cracks caused by the abrasive grains, were noted, thus confirming the removal of the work defect layers.

The roughness of the worked surface was measured with a surface roughness measuring apparatus (Talysurf), and the residual stress in the worked surface was measured with an X-ray stress measuring apparatus using the parallel-inclination method. Table 4 gives the results of these measurements. The results for the corresponding measurements of a ground surface are also shown for Reference Example 200 in Table 4.

The target thus obtained was placed in a magnetron sputtering apparatus, and sputtering was conducted by argon ion irradiation to deposit a silicide thin film of 3,000 Å on a five inch Si wafer.

The number of particles contained in the thin film was measured, and the results are listed in Table 4. The results confirm that the number of particles was remarkably reduced for the target according to Embodiment 200, and that by incorporating the lapping operation, the amount of particles in the thin film produced by the target could be largely reduced.

Embodiment 201

A sintered silicide substance having a diameter of 260 mm was ground and lapped in the same manner as in Embodiment 200, and was then polished with an acrylic resin polisher and 0.3 μm celium oxide abrasive grains for 15 hrs at a polisher pressure of 1 kg/cm², and a polisher speed of 10 m/min. The working solution was, removed by ultrasonic cleaning, and the polished surface was subsequently degreased by acetone and dried, thereby producing the finished target.

The worked surface was observed with an SEM, and work defect layers having grinding streaks, and holes and fine cracks caused by grinding were completely eliminated, with the finished surface having a mirror-like appearance. The results of the measurements of the surface roughness and residual stress in the worked surface are also listed in Table 4. Irregularities in the worked surface were extremely small in comparison to the ground surface of reference Example 200. Plastic and elastic deformations of the surface caused by grinding were almost entirely eliminated.

Magnetron sputtering was conducted using this target to form a silicide thin film on a five inch wafer. The number of particles in the film is also reported in Table 3. This result confirmed that the number of particles separated from the target could be greatly reduced by improving the surface condition by polishing as the final finishing step.

Embodiment 202

A sintered silicide substance having a diameter of 260 mm was ground and lapped as in Embodiment 200, and was then polished by a mechanical/chemical polishing method using a cloth polisher and 0.02 μm SiO₂ powder for 25 hrs under a polisher pressure of 1 kg/cm², and a polisher speed of 10 m/min. After ultrasonic cleaning, the polished surface was degreased with acetone and dried, thereby forming the finished target.

SEM observation of the worked surface revealed no work-defect layers caused by grinding, and that the surface roughness was extremely low in comparison with the ground surface and the residual stress was much lower. The worked surface was equivalent to a distortion free surface.

Magnetron sputtering was conducted using this target to form a silicide thin film on a five inch Si wafer, and the number of particles in the thin film was measured. The results shown in Table 4 reveal that very few particles were generated, and confirm that the work-defect layers and the residual stresses causing the separation of particles could be removed by the final finishing.

TABLE 4

|  | Surface roughness Ra (μm) | Residual compressive stress (kg/mm²) | Amount of generated particles (No.) |
| --- | --- | --- | --- |
| Embodiment 200 | 0.008 | 2.1 | 15 |
| Embodiment 201 | 0.005 | 1.2 | 10 |
| Embodiment 202 | 0.001 | 0.3 | 4 |
| Reference Example 200 | 0.78 | 12.0 | 235 |

According to the inventive sputtering target and method of forming the sputtering target, a target of high density and strength and minute structure, and therefore capable of substantially preventing the generation of particles, can be formed. Therefore, the invention is extremely advantageous for providing a thin film adapted for electrodes and wirings of semiconductor devices. The present invention has been described with respect to specific embodiments. However, other embodiments based on the principles of the present invention should be obvious to those of ordinary skill in the art. Such embodiments are intended to covered by the claims.

We claim:

1. A sputtering target comprising a two-phased structure consisting of a first phase of a stoichiometric composition MSi₂, where M is a metal, said first phase forming an interconnected matrix, and a second phase of Si discontinuously dispersed in said first phase, said target having an aluminum content of 1 ppm or less.

2. The sputtering target of claim 1 wherein the carbon content of the target is about 100 ppm or less.

3. The sputtering target of claim 2 wherein the relative density of the target is at least 99%.

4. The sputtering target of claim 1 wherein the oxygen content is about 150 ppm or less.

5. The sputtering target of claim 1 wherein said two-phased structure comprises from 400 to 400×10⁴ metal silicide grains per mm², and each said metal silicide grain having a grain diameter from about 0.5 to 30 μm.

6. The sputtering target of claim 1 wherein the average grain diameter of said metal silicide grains is from about 2 to 15 μm.

7. The sputtering target of claim 1 wherein the maximum grain diameter of said Si grains is about 30 μm or less.

8. The sputtering target of claim 1 wherein the average diameter of said Si grains is from about 2 to 10 μm.

9. The sputtering target of claim 1 wherein M is at least one metal selected from the group consisting of tungsten, molybdenum, titanium, zirconium, hafnium, niobium, tantalum, vanadium, cobalt, chromium, and nickel.

10. The sputtering target of claim 1 further comprising an interface layer between said metal silicide phase and said Si phase.

11. The sputtering target of claim 1 wherein the thickness of said interface layer is from about 100 to about 10,000 Å.

12. The sputtering target of claim 1 wherein said Si phase contains at least one element selected from the group consisting of B, P, Sb and As, and unavoidable impurities, and the electrical resistivity of said Si phase is from about 0.001 and 100 μΩ·cm.

13. The sputtering target of claim 1 wherein the surface roughness of the target is 0.05 μm or less.

14. The sputtering target of claim 1 wherein the residual stress of the target is 15 kg/mm₂ or less.

15. A method for manufacturing a sputtering target comprising a two-phased structure consisting of a metal silicide phase having a stoichiometric composition of MSi₂, where M is a metal, forming an interlinked and continuous structure, and a Si phase discontinuously dispersed in the metal silicide phase, wherein the aluminum content of the target is 1 ppm or less, said method comprising the steps of:

mixing metal powder (M) and Si powder (Si) at a Si/M atom ratio ranging from more than 2.0 to 4.0 to form a mixed powder;

placing said mixed powder in a mold having a partition plate on a surface thereof, and reducing the carbon and oxygen contents of said mixed powder by heating said powder under high vacuum at a low temperature;

heating said mixed powder under high vacuum and under a high applied pressure to synthesize and sinter said metal silicide; and further heating the synthesized and sintered metal silicide under a high vacuum and under a high applied pressure, to a temperature just below the eutectic temperature, to enhance the density and sintering of said metal silicide.

16. The method of claim 15 wherein the metal powder consists of a high purity metal powder having a maximum grain diameter of 10 μm or less, and the Si powder consists of a high purity Si powder having a maximum grain diameter of 30 μm or less.

17. The method of claim 15 further comprising subjecting said mixed powder to a reaction, melting and sintering process following the reduction of oxygen and carbon, so that silicide synthesis, sintering and densification of said metal silicide occur continuously.

18. The method of claim 17 wherein said reaction, melting and sintering process is performed by hot pressing.

19. The method of claim 15 wherein said low temperature is in the range of about 800° C. to about 1300° C.

20. The method of claim 15 wherein the applied pressure is in the range of about 100 kg/mm² to about 400 kg/mm².

21. The method of claim 15 further comprising the step of reducing the residual stress in the target.

* * * * *